Oct. 9, 1951 E. EBERHARD ET AL 2,570,436

CRYSTAL CONTROLLED OSCILLATOR

Filed Sept. 30, 1949

Inventors
Everett Eberhard &
Richard O. Endres
By
H. L. Newton
Attorney

Patented Oct. 9, 1951

2,570,436

UNITED STATES PATENT OFFICE 2,570,436

CRYSTAL CONTROLLED OSCILLATOR

Everett Eberhard, Haddonfield, and Richard O. Endres, Audubon, N. J., assignors to Radio Corporation of America, a corporation of Delaware Application September 30, 1949, Serial No. 118,963

12 Claims. (Cl. 250—36)

This invention relates generally to oscillators, and particularly relates to crystal controlled sine wave oscillators of the type including a semi-conductor device.

The three-electrode semi-conductor has recently been developed as an amplifier or oscillator. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948, issue. The new amplifier includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conducting material. This amplifier provides voltage as well as current gain under proper operating conditions and may be considered as a three-terminal network having a common input and output terminal. Thus, the device is effectively a four-terminal network having a common input and output electrode which may, for example, be the base electrode.

In a copending application to E. Eberhard, filed January 28, 1949, Serial No. 73,352 and entitled "Sine Wave Oscillators" a two-terminal sine wave oscillator has been disclosed where a parallel-resonant circuit is connected or coupled to the base electrode of a semi-conductor device. Another copending application to E. Eberhard, filed May 14, 1949, Serial No. 93,303 entitled "Two Terminal Sine Wave Oscillators" discloses a sine wave oscillator including a series resonant circuit connected either to the emitter electrode or to the collector electrode or connected between these two electrodes. It has been found that the oscillatory frequency of these oscillators is not solely a function of the resonant frequency of their resonant circuits but also depends on the voltages applied between the electrodes of the device. Hence, the frequency of the oscillatory wave is not as stable as may be desired for some applications.

It is accordingly a principal object of the present invention to provide a novel crystal-controlled oscillator of the type including a semi-conductor device.

A further object of the invention is to provide a novel sine-wave oscillator of the semi-conductor type where the oscillatory frequency is maintained at a fixed, predetermined value by a piezoelectric crystal.

A piezoelectric crystal when used as the frequency-controlling element of an oscillator has a high impedance; it is often compared to a parallel resonant circuit. Accordingly, in order to couple such a crystal to a semi-conductor device it is necessary to provide a high impedance looking into the electrode to which it is desired to connect the crystal. Fortunately, by suitable choice of the operating conditions of a semi-conductor amplifier or oscillator it is possible to provide a high impedance looking into any one of the three electrodes of the device. This may be effected by the use of positive feedback and by a suitable choice of the operating voltages or of the collector current of the device.

A crystal controlled oscillator in accordance with the present invention includes a semi-conductor device having a base electrode, an emitter electrode and a collector electrode. The piezoelectric crystal is connected to one of the three electrodes and the operating conditions of the device are selected so as to provide a high impedance looking into the electrode to which the crystal is connected. A resonant circuit is connected to another electrode of the device; its resonant frequency should be approximately equal to the resonant frequency of the crystal and positive feedback is added to the circuit to make oscillation possible. This positive feedback or regeneration is obtained by providing a high impedance in the base circuit. A sinusoidal output wave may be obtained from one of the electrodes to which the crystal is not connected.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
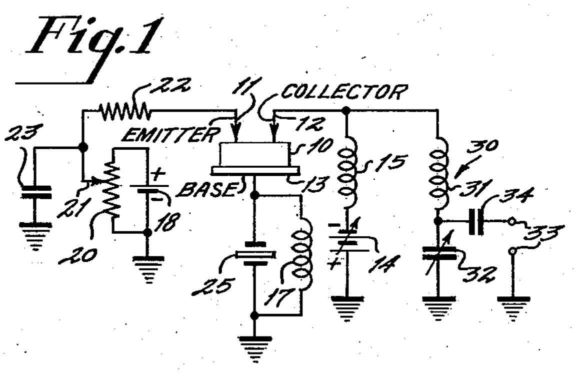
Figure 1 is a circuit diagram of a crystal controlled oscillator embodying the invention, the crystal being connected to the base electrode.

Referring now to the drawing, in which like components have been designated by the same reference numerals throughout the figures, and particularly to Figure 1, there is illustrated a crystal controlled oscillator in accordance with the invention comprising a semi-conductor device. The semi-conductor device includes body 10 of semi-conducting material which may, for example, consist of boron, silicon, germanium, tellurium or selenium containing a small but sufficient number of atomic impurity centers or lattice imperfections as commonly employed for best results in crystal rectifiers. Germanium is the preferred material for body 10 and may be prepared so as to be an electronic N type semi-conductor as is well known. The surface of semi-conducting body 12 may be polished and etched in a conventional manner. It is also feasible to utilize the germanium block from a commercial high-back-voltage germanium rectifier such as the type 1N34 in which case further surface treatment may not be required.

Semi-conducting body 10 is provided with emitter electrode 11, collector electrode 12 and base electrode 13. Emitter electrode 11 and collector electrode 12 are usually small-area electrodes and may be point contacts consisting, for example, of tungsten or Phosphor bronze wires having a diameter of the order of 2 to 5 mils. However, it is not essential that emitter electrode 11 and collector electrode 12 are small-area electrodes provided they provide rectifying, high-resistance contacts with body 10. Emitter and collector electrodes 11 and 12 are ordinarily placed closely adjacent to each other on the same surface of body 10 or on opposite surfaces thereof in which case they may be separated by a distance of from 2 to 5 mils. Base electrode 13 provides a low-resistance, non-rectifying contact with the bulk material of semi-conducting body 10 and usually is a large-area electrode.

A comparatively large reverse bias voltage is applied between collector electrode 12 and base electrode 13. Assuming a body 10 of N type semi-conducting material which is believed to have a P type surface layer, a negative voltage must be applied to collector electrode 12. To this end battery 14 may be provided which has its positive terminal grounded while its negative terminal is connected to collector electrode 12 through radio-frequency choke coil 15. Base electrode 13 is grounded through inductor 17. A comparatively small forward bias voltage is applied between emitter electrode 11 and base electrode 13. Assuming again a body 10 of N type semi-conducting material a positive voltage must be applied to emitter electrode 11. To this end there is provided battery 18 having its negative terminal grounded and across which potentiometer resistor 20 is connected. Variable tap 21 on resistor 20 is connected to emitter electrode 11 through resistor 22, the main purpose of which is to limit the current which is permitted to flow through the emitter electrode. Bypass capacitor 23 may be connected between tap 21 and ground.

In accordance with the present invention piezoelectric crystal 25 is connected between base electrode 13 and ground. Crystal 25 may, for example, consist of quartz or Rochelle salt and may be cut to have a selected resonant frequency. A piezoelectric crystal is usually a high impedance device and therefore it can only be connected to an electrode having a high internal impedance. However, it has been found as explained more in detail in the copending application to E. Eberhard filed May 28, 1949, Serial No. 95,926 and entitled "Signal Amplitude Control Systems" that the impedance looking into any one of the three electrodes of a semi-conductor device may be varied by varying, for example, the collector current $i_c$.

Figure 2:
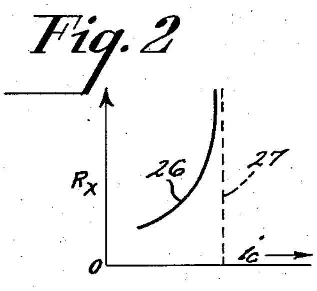
Figure 2 is a graph illustrating the resistance looking into the base electrode in dependence upon variations of the collector current.

Thus, Figure 2 shows curve 26 representing the resistance $R_x$ looking into base electrode 13 plotted with respect to the collector current $i_c$. Actually, the base resistance $R_x$ is a function also of the emitter bias voltage and of the collector bias voltage and may be adjusted by varying tap 21 or battery 14 as indicated in Figure 1. Dotted line 27 in Figure 2 indicates the point of infinite impedance. If the collector current increases further, the base resistance $R_x$ becomes negative and decreases from a high negative value to a low negative value.

The oscillator of Figure 1 is accordingly operated in a region close to dotted line 27 of Figure 2 to provide a high impedance looking into base electrode 15 thereby to match the impedance of the electrode to that of crystal 25.

In accordance with the present invention a series-resonant circuit 30 is now connected between collector electrode 12 and ground and includes inductor 31 and capacitor 32 which may be adjustable as shown. The operation of an oscillator of the type illustrated in Figure 1 without crystal 25 has been explained in detail in the copending application to Eberhard, Serial No. 93,303, above referred to. Thus, it can be shown that the circuit of Figure 1 will oscillate provided an appreciable impedance is connected to the base electrode and provided a low impedance resonant circuit is connected to either the collector or the emitter electrode. It is, of course, well known that a series-resonant circuit has a low impedance at its resonant frequency.

Inductor 17 provides a path for the direct current flowing between the electrodes of the device. The alternating-current impedance of inductor 17 preferably is high. However, it is to be understood that inductors 17 and 15 may be replaced by resistors in which case higher biasing voltages are required.

The resonant frequency of the oscillator of Figure 1 is determined by the resonant frequency of crystal 25. The resonant frequency of series-resonant circuit 30 should be approximately equal to that of crystal 25 but it need not be exactly the same. However, if series-resonant circuit 30 is excessively detuned, the crystal will lose control of the oscillatory frequency. A sinusoidal output wave may be obtained from series-resonant circuit 30 through output terminals 33, one of which is grounded while the other one is coupled through coupling capacitor 34 to the junction point between capacitor 32 and inductor 31. The frequency of the oscillator of Figure 1 is stabilized by crystal 25 and will not vary when the voltages of batteries 14 or 18 vary within certain limits.

Figure 3:
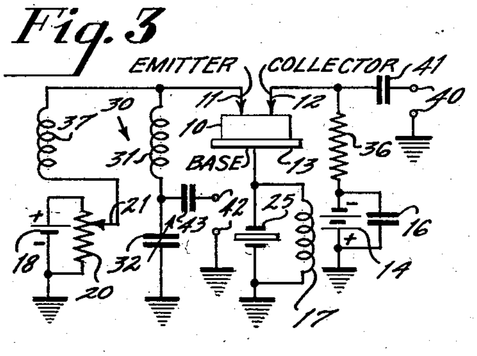
Figure 3 is a circuit diagram of a modified oscillator in accordance with the invention.

The oscillator of Figure 3 is a modification of that of Figure 1. The main difference is that the oscillator of Figure 3 has the series-resonant circuit 30 connected between emitter electrode 11 and ground. Battery 14 is connected to collector electrode 12 through a resistor 36. Battery 14 may now be bypassed for alternating currents by bypass capacitor 16. On the other hand, variable tap 21 of potentiometer 20 is connected to emitter electrode 11 through choke coil 37. Accordingly, bypass capacitor 23 may be omitted.

The oscillator of Figure 3 operates substantially in the same manner as that of Figure 1. The sinusoidal output wave may be derived from collector electrode 12 across collector resistor 36. To this end output terminals 40 may be connected between ground and through coupling capacitor 41 to collector electrode 12. Alternatively, the sinusoidal output wave may be derived across capacitor 32 of series resonant circuit 30 from output terminals 42. Thus, one of the output terminals 42 is grounded while the other one is coupled through coupling capacitor 43 to the junction point between inductor 31 and capacitor 32.

Figure 4:
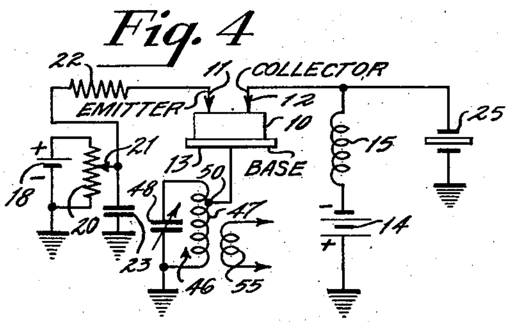
Figure 4 is a circuit diagram of an oscillator having the crystal connected to the collector electrode.

The oscillator of Figure 4 has its piezoelectric crystal 25 connected between collector electrode 12 and ground. The voltage of battery 14 may be applied to collector electrode 12 in parallel with crystal 25. Emitter electrode 11 is biased in the manner previously explained. Parallel resonant circuit 46 has one terminal provided and includes inductor 47 and capacitor 48 which may be adjustable as shown. A tap 50 on inductor 47 is connected to base electrode 13, the tap being arranged in such a manner that the impedances of the base electrode and of parallel-resonant circuit 46 are matched.

Figure 5:
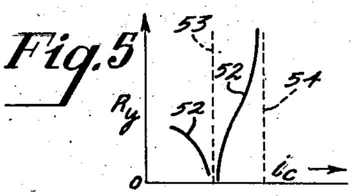
Figure 5 is a graph illustrating the resistance looking into the collector electrode as a function of the collector current.

In accordance with the present invention the oscillator of Figure 4 is biased in such a manner as to provide a high impedance looking into collector electrode 12 to which the piezoelectric crystal is connected. Curve 52 of Figure 5 illustrates the collector resistance $R_y$ plotted with respect to the collector current $i_c$. Dotted line 53 indicates a point of substantially zero resistance while dotted line 54 indicates the point where the collector resistance approaches infinity. As the collector current is further increased the collector resistance assumes a high negative value which thereafter decreases. The oscillator of Figure 4 is accordingly operated near dotted line 54 of Figure 5.

The operation of a sine oscillator of the type illustrated in Figure 4 without a piezoelectric crystal has been explained in the application of Eberhard, Serial No. 73,352 and also in a paper by Webster, Eberhard and Barton which appears on pages 5 to 16 (see particularly page 14) of the March 1949 issue of RCA Review. Briefly, oscillations are obtained due to the negative resistance which occurs looking into base electrode 13 when the external base impedance is high. The oscillatory frequency of the oscillator of Figure 4 is again determined by the resonant frequency of crystal 25. Parallel-resonant circuit 46 should be approximately tuned to the resonant frequency of crystal 25.

The oscillator of Figure 4 is superior to that of Figures 1 and 3 in that a sinusoidal output wave may be derived, for example, from inductor 55 inductively coupled to resonant circuit 46 because a better wave shape is developed across a parallel resonant circuit. The output wave is practically distortionless. It is to be understood that an impedance match between resonant circuit 46 and base electrode 13 may also be obtained in other ways such as by inductively coupling resonant circuit 46 to an inductor connected to the base lead. The alternating current impedance of inductor 15 shunting crystal 25 should be kept high.

Figure 6:
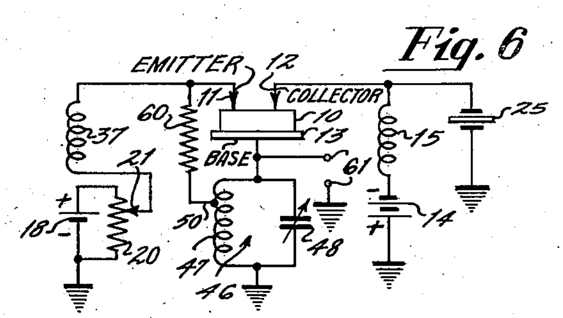
Figure 6 is a circuit diagram of a modification of the oscillator of Figure 4 employing an additional external feedback path.

The oscillator of Figure 6 is similar to that of Figure 4 except that an external feedback path is provided between base electrode 13 and emitter electrode 11. Parallel resonant circuit 46 is connected between base electrode 13 and ground. Resistor 60 is connected between emitter electrode 11 and tap 50 on inductor 47. The external feedback path includes resistor 60 but it is to be understood that the resistance of resistor 60 may be zero. Tap 21 on potentiometer 20 is connected to emitter electrode 11 through choke coil 37. The oscillator of Figure 6 is similar to a Hartley oscillator due to the introduction of a portion of the emitter-collector current into the lower portion of inductor 47. This external feedback aids the internal feedback provided by the negative resistance looking into base electrode 13.

With the oscillator of Figure 6 considerably higher output currents may be obtained. The sinusoidal output wave may be obtained from output terminals 61 connected across parallel-resonant circuit 46. However, the wave shape between emitter electrode 11 and ground is about as good as that across circuit 46 and the output wave may accordingly be obtained from the emitter electrode. Choke coils 15 and 37 may again be replaced by resistors but in this case the efficiency will be smaller. The direct current resistance of inductor 37 should be smaller than that of resistor 60.

Figures 7, 9:
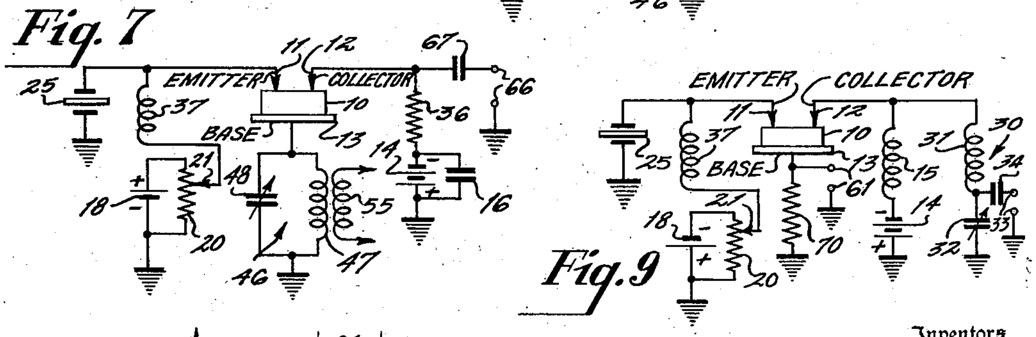
Figure 7 is a circuit diagram of an oscillator where the crystal is connected to the emitter electrode.
Figure 9 is a circuit diagram of an oscillator similar to that of Figure 7 but having a series-resonant circuit connected to the collector electrode.

The oscillator of Figure 7 has the piezoelectric crystal 25 connected to its emitter electrode 11. The bias voltage obtained from battery 18 is preferably supplied in parallel with the crystal through choke coil 37. Battery 14 is connected to collector electrode 12 through resistor 36. Parallel resonant circuit 46 is connected between base electrode 13 and ground.

Figure 8:
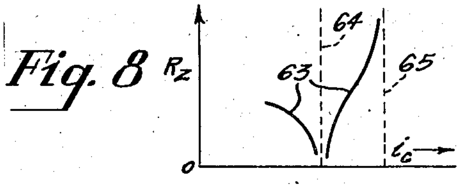
Figure 8 is a graph illustrating the resistance looking into the emitter electrode as a function of the collector current.

The oscillator of Figure 7 functions in a manner similar to that of Figure 4. The main distinction is that now crystal 25 is connected to the emitter electrode. Curve 63 of Figure 8 illustrates the resistance $R_z$ looking into the emitter electrode as a function of the collector current $i_c$. Dotted line 64 indicates a point where the impedance approaches zero. Dotted line 64 occurs at the same collector current value as dotted lines 54 and 27 of Figures 5 and 2 respectively. Dotted line 65 indicates a high collector resistance and the oscillator of Figure 7 is accordingly operated in that region. The external impedance of the base electrode should also be sufficiently high to operate the device in the region of oscillation.

A sinusoidal output wave may be obtained from coil 55, that is, across parallel resonant circuit 46. Alternatively, the output wave may be obtained from collector electrode 12 by means of output terminals 66, of which one is grounded while the other one is coupled to the collector electrode by coupling capacitor 67.

The oscillator of Figure 9 shows another modification of a crystal controlled oscillator in accordance with the invention. Crystal 25 is again connected to emitter electrode 11 and the emitter bias voltage is applied in parallel with the crystal. However, the polarity of battery 18 must be reversed in order to keep emitter electrode 11 at the proper positive voltage with respect to base electrode 13. Battery 14 is connected to collector electrode 12 through inductor 15. Series resonant circuit 30 is connected between collector electrode 12 and ground. Resistor 70 is connected between base electrode 13 and ground and normally maintains the base electrode at a negative value.

The oscillator of Figure 9 oscillates by virtue of the series resonant circuit 30 connected to its collector electrode. Resistor 70 provides a high impedance in the base circuit which is a necessary condition to provide a negative resistance looking into the base electrode thereby to produce oscillation. The sinusoidal output wave may be obtained from output terminals 61 connected across base resistor 70 or alternatively from output terminals 33 connected across capacitor 32 of series-resonant circuit 30.

The wave shape of the oscillator of Figure 9 is not as good as that which may be obtained, for example, from the oscillator of Figure 7. This is due to the fact that a better wave shape is obtained in a parallel-resonant circuit. It is to be understood that crystal 25 and series resonant circuit 30 may be exchanged. In other words, crystal 25 may be connected to collector electrode 12 while series-resonant circuit 30 may be connected to the emitter electrode.

There have thus been disclosed novel crystal controlled oscillators of the semi-conductor type. The piezoelectric crystal may be connected to any one of the three electrodes of the semi-conductor device while a resonant circuit is connected to another electrode of the device. The frequency of the oscillatory wave is stabilized by the provision of the crystal and does not vary with small variations of the bias voltage. The wave shape which may be obtained from some of the novel oscillators is very good and the output current may be fairly high.

What is claimed is:

1. A crystal controlled oscillator comprising a semi-conductor device having a semi-conducting body, a base electrode, an emitter electrode and a collector electrode in contact with said body, means for applying a reverse bias voltage between said collector and base electrodes and for applying a forward bias voltage between said emitter and base electrodes, said voltages being adjusted to provide a high impedance looking into a predetermined one of said electrodes, a piezoelectric device having a selected resonant frequency connected to said predetermined electrode, means coupled to said base electrode for providing positive feedback in said semi-conductor device, and a resonant circuit tuned approximately to the resonant frequency of said device and coupled to one of said other electrodes, whereby the resonant frequency of said oscillator is determined by the resonant frequency of said piezoelectric device.

2. A crystal controlled oscillator comprising a semi-conductor device having a semi-conducting body, a base electrode, an emitter electrode and a collector electrode in contact with said body, means for applying a reverse bias voltage between said collector and base electrodes and for applying a forward bias voltage between said emitter and base electrodes, said voltages being adjusted to provide a high impedance looking into a predetermined one of said electrodes, a piezoelectric crystal having a selected resonant frequency and connected between said predetermined electrode and a point of fixed potential, a resonant circuit tuned approximately to the resonant frequency of said crystal and coupled to one of said other electrodes, means coupled to said base electrode for providing positive feedback in said semi-conductor device, and an output circuit coupled to one of said other electrodes for deriving a sinusoidal wave of a frequency determined by the resonant frequency of said crystal.

3. A crystal controlled oscillator comprising a semi-conductor device having a semi-conducting body, a base electrode, an emitter electrode and a collector electrode in contact with said body, means for applying a reverse bias voltage between said collector and base electrodes and for applying a forward bias voltage between said emitter and base electrodes, said voltages being adjusted to provide a high impedance looking into said base electrode, a piezoelectric crystal having a desired resonant frequency and connected to said base electrode, and a series-resonant circuit tuned approximately to the resonant frequency of said crystal and connected to one of said other electrodes, whereby the resonant frequency of said oscillator is determined by the resonant frequency of said crystal.

4. A crystal controlled oscillator comprising a semi-conductor device having a semi-conducting body, a base electrode, an emitter electrode and a collector electrode in contact with said body, means for applying a relatively large reverse bias voltage between said collector and base electrodes and for applying a relatively small forward bias voltage between said emitter and base electrodes, said voltages being adjusted to provide a high impedance looking into said base electrode, a piezoelectric crystal having a desired resonant frequency and connected between said base electrode and a point of fixed potential, a conductive impedance element in shunt with said crystal, a series-resonant circuit tuned approximately to the resonant frequency of said crystal and connected to said collector electrode, and an output circuit coupled to said series-resonant circuit for deriving a sinusoidal wave of a frequency determined by the resonant frequency of said crystal.

5. A crystal controlled oscillator comprising a semi-conductor device having a semi-conducting body, a base electrode, an emitter electrode and a collector electrode in contact with said body, means for applying a relatively large reverse bias voltage between said collector and base electrodes and for applying a relatively small forward bias voltage between said emitter and base electrodes, said voltages being adjusted to provide a high impedance looking into said base electrode, a piezoelectric crystal having a desired resonant frequency and connected between said base electrode and a point of fixed potential, an inductor in shunt with said crystal, a series-resonant circuit including a capacitor tuned approximately to the resonant frequency of said crystal and connected to said emitter electrode, and an output circuit coupled across said capacitor for deriving a sinusoidal wave of a frequency determined by the resonant frequency of said crystal.

6. A crystal controlled oscillator comprising a semi-conductor device having a semi-conducting body, a base electrode, an emitter electrode and a collector electrode in contact with said body, means for applying a reverse bias voltage between said collector and base electrodes and for applying a forward bias voltage between said emitter and base electrodes, said voltages being adjusted to provide a high impedance looking into said collector electrode, a piezoelectric crystal having a selected resonant frequency and connected to said collector electrode, means coupled to said base electrode for providing positive feedback in said semi-conductor device, and a resonant circuit tuned approximately to the resonant frequency of said crystal and coupled to one of said other electrodes, whereby the resonant frequency of said oscillator is determined by the resonant frequency of said crystal.

7. A crystal controlled oscillator comprising a semi-conductor device having a semi-conducting body, a base electrode, an emitter electrode and a collector electrode in contact with said body, means for applying a relatively large reverse bias voltage between said collector and base electrodes and for applying a relatively small forward bias voltage between said emitter and base electrodes, said voltages being adjusted to provide a high impedance looking into said collector electrode, a piezoelectric crystal having a selected resonant frequency connected between said collector electrode and a point of fixed potential, a parallel-resonant circuit tuned approximately to the resonant frequency of said crystal and coupled to said base electrode, and an output circuit coupled to said parallel-resonant circuit for deriving a sinusoidal wave of a frequency determined by the resonant frequency of said crystal.

8. A crystal controlled oscillator comprising a semi-conductor device having a semi-conducting body, a base electrode, an emitter electrode and a collector electrode in contact with said body, means for applying a relatively large reverse bias voltage between said collector and base electrodes and for applying a relatively small forward bias voltage between said emitter and base electrodes, said voltages being adjusted to provide a high impedance looking into said collector electrode, a piezoelectric crystal having a selected resonant frequency connected between said collector electrode and a point of fixed potential, a parallel-resonant circuit including an inductor tuned approximately to the resonant frequency of said crystal and connected between said base electrode and said point of fixed potential, and a circuit connection between an intermediate point of said inductor and said emitter electrode.

9. A crystal controlled oscillator comprising a semi-conductor device having a semi-conducting body, a base electrode, an emitter electrode and a collector electrode in contact with said body, means for applying a relatively large reverse bias voltage between said collector and base electrodes and for applying a relatively small forward bias voltage between said emitter and base electrodes, said voltages being adjusted to provide a high impedance looking into said collector electrode, a piezoelectric crystal having a selected resonant frequency connected between said collector electrode and a point of fixed potential, a parallel-resonant circuit including an inductor tuned approximately to the resonant frequency of said crystal and connected between said base electrode and said point of fixed potential, a resistor connected between an intermediate point of said inductor and said emitter electrode, and an output circuit coupled across said parallel-resonant circuit for deriving a sinusoidal wave.

10. A crystal controlled oscillator comprising a semi-conductor device having a semi-conducting body, a base electrode, an emitter electrode and a collector electrode in contact with said body, means for applying a reverse bias voltage between said collector and base electrodes and for applying a forward bias voltage between said emitter and base electrodes, said voltages being adjusted to provide a high impedance looking into said emitter electrode, a piezoelectric crystal having a selected resonant frequency and connected to said emitter electrode, a resonant circuit tuned approximately to the resonant frequency of said crystal and coupled to one of said other electrodes, means coupled to said base electrode for providing positive feedback in said semi-conductor device, and an output circuit coupled to said resonant circuit for deriving a sinusoidal wave of a frequency determined by the resonant frequency of said crystal.

11. A crystal controlled oscillator comprising a semi-conductor device having a semi-conducting body, a base electrode, an emitter electrode and a collector electrode in contact with said body, means for applying a relatively large reverse bias voltage between said collector and base electrodes and for applying a relatively small forward bias voltage between said emitter and base electrodes, said voltages being adjusted to provide a high impedance looking into said emitter electrode, a piezoelectric crystal having a selected resonant frequency and connected between said emitter electrode and a point of fixed potential, and a parallel-resonant circuit tuned approximately to the resonant frequency of said crystal and connected to said base electrode, whereby the resonant frequency of said oscillator is determined by the resonant frequency of said crystal.

12. A crystal controlled oscillator comprising a semi-conductor device having a semi-conducting body, a base electrode, an emitter electrode and a collector electrode in contact with said body, means for applying a relatively large reverse bias voltage between said collector and base electrodes and for applying a relatively small forward bias voltage between said emitter and base electrodes, said voltages being adjusted to provide a high impedance looking into said emitter electrode, a piezoelectric crystal having a selected resonant frequency and connected between said emitter electrode and a point of fixed potential, a conductive impedance element connected between said base electrode and said point of fixed potential, and a series-resonant circuit tuned approximately to the resonant frequency of said crystal and connected to said collector electrode.

EVERETT EBERHARD.
RICHARD O. ENDRES.

REFERENCES CITED

The following references are of record in the file of this patent:

UNITED STATES PATENTS

| Number | Name | Date |
|---|---|---|
| 2,415,049 | Snyder | Jan. 28, 1947 |
| 2,476,323 | Rack | July 19, 1949 |